US006919543B2

(12) United States Patent
Abbott et al.

(10) Patent No.: US 6,919,543 B2
(45) Date of Patent: Jul. 19, 2005

(54) RESISTIVE HEATERS AND USES THEREOF

(75) Inventors: Richard C. Abbott, New Boston, NH (US); Gary P. Magnant, Topsfield, MA (US); William A. Glenn, Groton, MA (US)

(73) Assignee: Thermoceramix, LLC, Shirley, MA (US)

( * ) Notice: Subject to any disclaimer, the term of this patent is extended or adjusted under 35 U.S.C. 154(b) by 17 days.

(21) Appl. No.: 09/996,183

(22) Filed: Nov. 28, 2001

(65) Prior Publication Data

US 2002/0096512 A1 Jul. 25, 2002

Related U.S. Application Data

(60) Provisional application No. 60/253,969, filed on Nov. 29, 2000.

(51) Int. Cl.$^7$ ................................................. H05B 3/16
(52) U.S. Cl. ..................... 219/543; 219/216; 219/469
(58) Field of Search ............................ 219/541, 543, 219/544, 469, 270, 216, 465.1, 553, 471, 470; 428/446, 698, 699; 427/96; 338/306, 307, 308, 309; 29/611, 612, 613; 392/438, 439

(56) References Cited

U.S. PATENT DOCUMENTS

| | | | |
|---|---|---|---|
| 2,799,764 A | 7/1957 | Chandler | |
| 3,425,864 A | 2/1969 | Morey | |
| 3,697,728 A | 10/1972 | Stirzenbecher | |
| 3,922,386 A | * 11/1975 | Ros .............................. | 427/96 |
| 3,968,347 A | 7/1976 | Isoard | |
| 4,032,751 A | 6/1977 | Youtsey et al. | |
| 4,280,046 A | 7/1981 | Shimotori et al. | |
| 4,296,309 A | * 10/1981 | Shinmi et al. ............... | 347/204 |
| 4,310,745 A | 1/1982 | Bender | |
| 4,377,618 A | 3/1983 | Ikeda et al. | |
| 4,388,522 A | 6/1983 | Boaz | |
| 4,469,936 A | 9/1984 | Hunter | |
| 4,485,297 A | 11/1984 | Grise et al. | |
| 4,498,071 A | 2/1985 | Plough, Jr. et al. | |
| 4,697,165 A | 9/1987 | Ishiguro et al. | |
| 4,713,530 A | 12/1987 | Schittenhelm et al. | |
| 4,720,716 A | 1/1988 | Ikeda et al. | |
| 4,724,305 A | * 2/1988 | Iimura et al. ................ | 219/469 |
| 4,725,710 A | 2/1988 | Ramus et al. | |
| 4,733,055 A | 3/1988 | Cunningham | |
| 4,743,940 A | 5/1988 | Nagasaka et al. | |
| 4,776,070 A | 10/1988 | Shibata et al. | |
| 4,808,490 A | * 2/1989 | Tsukuda et al. ............. | 428/699 |
| 4,813,372 A | 3/1989 | Kogure et al. | |
| 4,857,689 A | 8/1989 | Lee | |
| 4,860,434 A | 8/1989 | Louison et al. | |
| 4,868,899 A | 9/1989 | Bard et al. | |
| 4,870,388 A | 9/1989 | Sugata et al. | |
| 4,889,974 A | 12/1989 | Auding et al. | |
| 4,970,376 A | 11/1990 | Mellor et al. | |
| 5,004,893 A | 4/1991 | Westover | |

(Continued)

FOREIGN PATENT DOCUMENTS

| | | |
|---|---|---|
| DE | 3325204 A1 | 1/1985 |
| GB | 924497 | 4/1963 |
| GB | 2099670 A | 12/1982 |

(Continued)

*Primary Examiner*—Robin O. Evans
*Assistant Examiner*—Leonid M Fastovsky
(74) *Attorney, Agent, or Firm*—Hayes Soloway PC; Peter A. Nieves

(57) ABSTRACT

A metallic resistive heater and a method of production are described. The resistive heater has a metallic component that is electrically conductive (i.e. has low resistivity) and an oxide, nitride, carbide, and or boride derivative of the metallic component that is electrically insulating (i.e., has high resistivity). The resistivity is controlled by controlling the amount of oxide, nitride, carbide, and boride formation during the deposition of the metallic component and the derivative.

18 Claims, 3 Drawing Sheets

U.S. PATENT DOCUMENTS

| | | | |
|---|---|---|---|
| 5,039,840 A | * 8/1991 | Boardman | 219/270 |
| 5,060,354 A | 10/1991 | Chizinsky | |
| 5,213,848 A | 5/1993 | Zurecki et al. | |
| 5,252,807 A | 10/1993 | Chizinsky | |
| 5,254,359 A | 10/1993 | Zurecki et al. | |
| 5,260,014 A | 11/1993 | Holton et al. | |
| 5,296,178 A | 3/1994 | Sugihara et al. | |
| 5,364,522 A | 11/1994 | Wang | |
| 5,395,606 A | 3/1995 | Xiao et al. | 423/411 |
| 5,408,070 A | 4/1995 | Hyllberg | |
| 5,408,574 A | 4/1995 | Deevi et al. | |
| 5,418,885 A | 5/1995 | Hauser et al. | |
| 5,420,395 A | 5/1995 | Hyllberg et al. | |
| 5,437,547 A | 8/1995 | Holton et al. | |
| 5,444,217 A | 8/1995 | Moore et al. | |
| 5,498,855 A | 3/1996 | Deevi et al. | |
| 5,504,307 A | 4/1996 | Hayashi et al. | |
| 5,534,231 A | 7/1996 | Savas | |
| 5,595,241 A | 1/1997 | Jelinek | |
| 5,600,414 A | 2/1997 | Hyllberg | |
| 5,616,263 A | 4/1997 | Hyllberg | |
| 5,616,266 A | 4/1997 | Cooper | |
| 5,624,591 A | 4/1997 | DiTrapani | |
| 5,643,483 A | 7/1997 | Kubota et al. | |
| 5,643,839 A | 7/1997 | Takagi | |
| 5,646,482 A | 7/1997 | Suzuki et al. | |
| 5,665,262 A | 9/1997 | Hajaligol et al. | |
| 5,724,187 A | 3/1998 | Varaprasad et al. | |
| 5,753,891 A | 5/1998 | Iwata et al. | |
| 5,756,215 A | * 5/1998 | Sawamura et al. | 428/446 |
| 5,822,675 A | 10/1998 | Pacquet et al. | |
| 5,841,111 A | 11/1998 | Shea et al. | |
| 5,889,261 A | * 3/1999 | Boardman | 219/543 |
| 5,939,151 A | 8/1999 | Prichard et al. | |
| 6,069,346 A | * 5/2000 | Hyllberg | 219/469 |
| 6,074,194 A | 6/2000 | McHugh | |
| 6,127,654 A | * 10/2000 | Fletcher | 219/216 |
| 6,133,557 A | * 10/2000 | Kawanabe et al. | 219/544 |
| 6,225,608 B1 | * 5/2001 | Kallgren | 219/465.1 |
| 6,252,199 B1 | * 6/2001 | Toyota et al. | 219/216 |
| 6,258,416 B1 | 7/2001 | Seitz | |
| 6,376,816 B2 | * 4/2002 | Cooper et al. | 219/543 |
| 6,555,257 B1 | * 4/2003 | Nishioka et al. | 428/698 |
| 2003/0066682 A1 | * 4/2003 | Boardman | 219/543 |

FOREIGN PATENT DOCUMENTS

| | | |
|---|---|---|
| WO | WO 96/11288 | 4/1996 |
| WO | WO 96/37763 | 11/1996 |
| WO | WO 97/03236 | 1/1997 |
| WO | WO 97/33300 | 9/1997 |
| WO | WO 98/51127 | 11/1998 |
| WO | WO 00/29635 | 5/2000 |
| WO | WO 00/70915 | 11/2000 |
| WO | WO 01/43506 A1 | 6/2001 |

* cited by examiner

RESISTIVE HEATERS AND USES THEREOF

CROSS REFERENCE TO RELATED APPLICATIONS

This application claims benefit of co-pending U.S. Provisional Application Ser. No. 60/253,969, filed Nov. 29, 2000, hereby incorporated by reference.

BACKGROUND OF THE INVENTION

The invention relates to the field of resistive heaters.
Thermal Spray

Thermal spray is a versatile technology for depositing coatings of metals or ceramics. It includes systems that use powder as feedstock (e.g., arc plasma, flame spray, and high velocity oxy-fuel (HVOF) systems), and systems that use wire as feedstock (e.g., arc wire, HVOF wire, and flame spray systems).

Arc plasma spraying is a method for depositing materials on various substrates. A DC electric arc creates an ionized gas (a plasma) that is used to spray molten powdered materials in a manner similar to spraying paint.

Arc wire spray systems function by melting the tips of two wires (e.g., zinc, copper, aluminum, or other metal) and transporting the resulting molten droplets by means of a carrier gas (e.g., compressed air) to the surface to be coated. The wire feedstock is melted by an electric arc generated by a potential difference between the two wires.

In flame spray, a wire or powder feedstock is melted by means of a combustion flame, usually effected through ignition of gas mixtures of oxygen and another gas (e.g., acetylene).

HVOF uses combustion gases (e.g., propane and oxygen) that are ignited in a small chamber. The high combustion temperatures in the chamber cause a concurrent rise in gas pressure that, in turn, generates a very high speed effluent of gas from an orifice in the chamber. This hot, high speed gas is used to both melt a feedstock (e.g., wire, powder, or combination thereof) and transport the molten droplets to the surface of a substrate at speeds in the range of 330–1000 m/sec. Compressed gas (e.g., compressed air) is used to further accelerate the droplets and cool the HVOF apparatus.

A thermal sprayed coating has a unique microstructure. During the deposition process, each particle enters the gas stream, melts, and cools to the solid form independent of other particles. When molten particles impact the substrate being coated, they impact ("splat") as flattened circular platelets and freeze at high cooling rates. The coating is built up on the substrate by traversing the plasma gun apparatus repeatedly over the substrate building up layer by layer until the desired thickness of coating has been achieved. Because the particles solidify as splats, the resultant microstructure is very lamellar with the grains approximating circular platelets randomly stacked above the plane of the substrate.
Resistive Heaters Thermal spray technology has been used to deposit a coating for use as a heater. A resistive heater produces heat by the collision of electrons with the atoms of the heater material. The rate at which heat is generated is the power, which depends on the amount of current flowing and the resistance to the current flow offered by the material. The resistance of a heater depends on a material property termed "resistivity," and a geometric factor describing the length of the current path and the cross-sectional area through which the current passes.

Previously, resistive coatings have been deposited using thermal spray. In one such example, metal alloys such as 80% Nickel-20% Chrome are deposited and used as heaters. In another example, a metal alloy in powder form is mixed with powders of electrical insulators such as aluminum oxide prior to deposition. The blended material is then deposited using thermal spray to form a coating of resistive material. When nickel-chrome is deposited as a resistive heater, however, the bulk resistivity of the layer is still rather low, which makes it more difficult to form an element because a long path length is required to achieve a high enough resistance. When oxide-metal blends are deposited, large discontinuities in the composition of resistive layer, which produce variations in power distribution over a substrate, are frequently present.
Molding Thermoplastic Materials Many plastic and metal parts are manufactured by injecting molten metal or polymer melt into a complex cavity cut into steel, for example, aluminum automobile transmission housings or polycarbonate computer cases. Injection-molding machinery melts a thermoplastic powder in a heating chamber and forces it into a mold, where it hardens. The operations take place at rigidly controlled temperatures and intervals. In an injection molding process, it is important to maintain a material such as polycarbonate in a molten state as it flows into and through a mold cavity space. Additionally, the shear stress profile of the flow of resin must be monitored and managed to insure proper filling of the cavity space. If the molten resin solidifies too rapidly when it encounters a cold mold, it will not penetrate narrow cavities and will form weak knit lines where two flows intersect. Accordingly, much effort has been directed towards improving heat management and flow control in the injection molding process.

SUMMARY OF THE INVENTION

The present invention features a metallic resistive heater and uses thereof. The resistive heater includes a metallic component that is electrically conductive (i.e., has low resistivity) and an oxide, nitride, carbide, and/or boride derivative of the metallic component that is electrically insulating (i.e., has high resistivity). The resistivity is controlled in part by controlling the amount of oxide, nitride, carbide, and boride formation during the deposition of the metallic component and the derivative. The resistive heater has numerous industrial and commercial applications (i.e, production of molded thermoplastic parts, paper, and semiconductor wafers).

Accordingly, in a first aspect, the invention features a resistive heater that includes a resistive layer coupled to a power source. The resistive layer includes a metallic component and one or more oxide, nitride, carbide, and/or boride derivatives of the metallic component. The resistivity of the resistive layer results from the amount of the oxide, nitride, carbide, and/or boride present in the resistive layer. Desirably, the resistive heater is disposed on a substrate such as a mold cavity surface.

In one embodiment, the resistive layer has a microstructure that resembles a plurality of flattened discs or platelets having an outer region of nitride, oxide, carbide, and/or boride derivatives of the metallic component, and an inner region of the metallic component.

In a second, related aspect, the invention features a resistive heater on a substrate, the heater made by a method that includes the steps of providing a substrate, a metallic component feedstock, and a gas including oxygen, nitrogen, carbon, and/or boron; melting the feedstock to produce a stream of molten droplets; reacting the molten droplets with the gas to produce one or more oxide, nitride, carbide, or boride derivatives of the metallic component, wherein a portion of the metallic component reacts with the gas to produce the oxide, nitride, carbide, and/or boride derivative of the metallic component and a portion of the metallic component remains unreacted; depositing the unreacted metallic component and the oxide, nitride, carbide, and/or boride derivative of the metallic component onto the substrate to produce a resistive layer; and connecting the resistive layer to a power supply.

In one embodiment of the heater of the second aspect, the melting step and the reacting step are coordinated such that the resistive layer has a resistivity of 0.0001 to 1.0 Ω·cm (e.g., 0.0001 to 0.001 Ω·cm, 0.001 to 0.01 Ω·cm, 0.01 to 0.1 Ω·cm, or 0.1 to 1.0 Ω·cm). In another embodiment, the molten droplets have an average diameter of 5 to 150 µm, 10 to 100 µm, or 20 to 80 µm. In other desirable embodiments, the method includes the additional step of applying a ceramic or metallic layer superficial to the resistive layer, an electrically insulating layer between the substrate and the resistive layer, and/or an adhesion layer between the substrate and the insulating layer.

In a third aspect, the invention features a method of producing a resistive heater on a substrate. The method includes the steps of providing a substrate, a metallic component feedstock, and a gas including oxygen, nitrogen, carbon, and/or boron; melting the feedstock to produce a stream of molten droplets; reacting the molten droplets with the gas to produce one or more oxide, nitride, carbide, or boride derivatives of the metallic component, wherein a portion of the metallic component reacts with the gas to produce the oxide, nitride, carbide, and/or boride derivative of the metallic component and a portion of the metallic component remains unreacted; depositing the unreacted metallic component and the oxide, nitride, carbide, and/or boride derivative of the metallic component onto the substrate to produce a resistive layer; and connecting the resistive layer to a power supply.

In particular embodiments of any of the first, second, and third aspects, the substrate is an injection mold, a roller, or a platen for semiconductor wafer processing.

In yet another aspect, the invention features an injection mold that includes (i) a mold cavity surface and (ii) a coating that includes a resistive heater that in turn includes a resistive layer coupled to a power supply, the coating being present on at least a portion of the surface. The resistive layer includes a metallic component and one or more oxide, nitride, carbide, and/or boride derivatives of the metallic component. In one embodiment, the resistivity of the resistive layer results from the amount of the oxide, nitride, carbide, and/or boride present in the resistive layer. Desirably, the mold includes a runner, and the coating is disposed on at least a portion of a surface of the runner.

In still another aspect, the invention features a method of making a molded product. This method includes the steps of providing an injection mold as described above; injecting a thermoplastic melt into the mold; and cooling the melt in the mold to form the molded product. The heated resistive heater regulates solidification and cooling of the melt. In one embodiment, the resistive heater is produced by the method described above.

In another aspect, the invention features a cylindrical roller including an outer surface, an inner surface surrounding a hollow core, and a resistive heater including a resistive layer coupled to a power source. The resistive layer includes a metallic component and one or more oxide, nitride, carbide, and/or boride derivatives of the metallic component, and is disposed on the outer surface and/or on the inner surface of the cylindrical roller.

In still another aspect, the invention features a method of drying paper during manufacturing. This method includes the steps of providing paper including a water content of greater than about 5% and one or more cylindrical rollers as described above; heating the roller with the resistive heater; and contacting the paper with the roller for a time suitable for drying the paper to a water content of less than about 5%.

In another aspect, the invention features a semiconductor wafer processing system including an enclosure defining a reaction chamber; a support structure mounted within the reaction chamber, the support structure mounting a semiconductor wafer to be processed within the chamber; and a resistive heater including a resistive layer coupled to a power source, the resistive layer including a metallic component and one or more oxide, nitride, carbide, and/or boride derivatives of the metallic component. In one embodiment, a heater is placed on the top of the reaction chamber such that one side (typically polished) of a wafer may be placed adjacent to or in contact with the heater. In another embodiment, a heater is placed on the bottom of the chamber such that one side (polished or unpolished) of a wafer may be placed adjacent to or in contact with the heater. In yet another embodiment, heaters are placed on the top and the bottom of the chamber.

In still another aspect, the invention features a method for heating a semiconductor wafer including the steps of providing a semiconductor wafer and a semiconductor wafer processing system as described above; and heating the wafer with the resistive heater.

In various embodiments of any of the foregoing aspects, the resistive layer has a resistivity of 0.0001 to 1.0 Ω·cm (e.g., 0.0001 to 0.001 Ω·cm, 0.001 to 0.01 Ω·cm, 0.01 to 0.1 Ω·cm, or 0.1 to 1.0 Ω·cm), and the application of current from the power supply to the resistive layer results in production of heat by the resistive layer. Preferably, the resistive layer is capable of generating a sustained temperature of greater than 200° F., 350° F., 400° F., 500° F., 1200° F. or 2200° F. In various other embodiments, the resistive heater includes an electrically insulating layer (e.g., a layer including aluminum oxide or silicon dioxide) between the substrate and the resistive layer; an adhesion layer (e.g., one including nickel-chrome alloy or nickel-chrome-aluminum-yttrium alloy) between the insulating layer and the substrate, a heat reflective layer (e.g., a layer including zirconium oxide) between the resistive layer and the substrate, a ceramic layer (e.g., one including aluminum oxide) superficial to the resistive layer, and/or a metallic layer (e.g., one including molybdenum or tungsten) superficial to the resistive layer. Desirably, the metallic component of the resistive heater is titanium (Ti), silicon (Si), aluminum (Al), zirconium (Zr), cobalt (Co), nickel (Ni), or alloys or combinations thereof. Other suitable metallic components are described herein.

A particular embodiment of the invention includes the use of insulating layers positioned above or below the heater to insulate the resistive layer electrically from adjacent, electrically conductive components. Additional layers can be added to reflect or emit heat from the heater in a selected pattern. One or more layers can also be included to provide improved thermal matching between components to prevent bending or fracture of different layers having different coefficients of thermal expansion. Layers that improve the adhesion between layers and the substrate may also be used.

By "metallic component" is meant a metal, metalloid, or composite thereof capable of forming an oxide, carbide, nitride, and/or boride by reaction with a gas.

By "metallic component feedstock" is meant a metallic component in a physical form suitable for use in thermal spraying. Exemplary physical forms include, without limitation, wire, powder, and ingots.

Exemplary metallic components include, without limitation, transition metals such as titanium (Ti), vanadium (V), cobalt (Co), nickel (Ni), and transition metal alloys; highly reactive metals such as magnesium (Mg), zirconium (Zr), hafnium (Hf), and aluminum (Al); refractory metals such as tungsten (W), molybdenum (Mo), and tantalum (Ta); metal composites such as aluminum/aluminum oxide and cobalt/tungsten carbide; and metalloids such as silicon (Si).

By "substrate" is meant any object on which a resistive layer is deposited. The substrate may be, e.g., bare ceramic, or it may have one or more layers, e.g., an electrically insulating layer, on its surface.

By "thermoplastic material" is meant a material capable of softening or fusing when heated and of hardening again when cooled. Exemplary thermoplastic materials include metals and thermoplastic organic polymers. A "thermoplastic melt" is the softened or molten thermoplastic material.

By "cycle time" is meant the time elapsed between a certain point in one cycle and that same point in the next cycle. For example, the cycle time for injection molding is measured as the time between injections of thermoplastic melt into a mold.

By "runner" is meant a channel that transports a thermoplastic melt from an entrance to a mold to the cavity.

Other features and advantages will be apparent from the description of the preferred embodiments, and from the claims.

DETAILED DESCRIPTION

Figure 1:
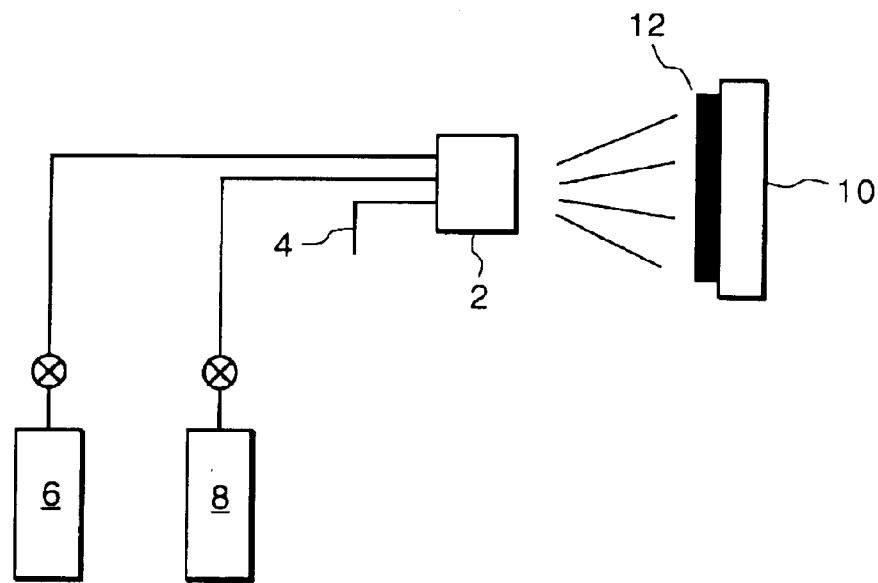
FIG. 1 shows an illustration of an HVOF wire system 2 that uses metal wire 4 as feedstock and combustion of fuel gases 6 for melting the feedstock. A reactant gas 8 reacts with the molten feedstock and transports the molten droplets to a substrate 10 to produce a layer 12.

We have discovered a metallic resistive layer (and methods of making same) that includes a metallic component that is electroconductive and an oxide, nitride, carbide, and/or boride derivative of the metal component that is electrically insulating. We have further discovered that this resistive layer, when coupled to a power supply, functions as a heater.

To deposit a layer that will generate heat when a voltage is applied, the layer must have a resistance that is determined by the desired power level. The resistance, R, is calculated from the applied voltage, V, and the desired power level, P, from:

$$R=V^2/P$$

The resistance is related to the geometry of the heater coating—the electric current path length, L, and the cross sectional area, A, through which the current passes—and also to the material resistivity, $\rho$, by the equation:

$$R=\rho L/A$$

Therefore, to design a layer for a given power level and a given geometry that will operate at a given voltage, one has only to determine the resistivity of the material by:

$$\rho=R\,A/L=V^2 A/PL$$

In the present invention, the resistivity is controlled in part by controlling the amount of oxide, nitride, carbide, and boride formation during the deposition of the metallic component and the derivative.

That the resistivity is a controlled variable is significant because it represents an additional degree of freedom for the heater designer. In most situations, the resistivity of the heater material, e.g., nichrome, is a fixed value. In such an instance, the heater designer must arrange the heater geometry (L and A) to obtain the desired power. For example, if it is desired to heat a tube by winding nichrome wire around it, the designer must choose the correct diameter wire for A, the cross sectional area through which the electric current must pass, and the spacing of the windings for L, the total path length of the electric current.

We now describe the resistive layer, its application as a component of a coating, and its use as a resistive heater.

Metallic Components and Oxides Nitrides, Carbides, and Borides thereof

Metallic components of the invention include any metals or metalloids that are capable of reacting with a gas to form a carbide, oxide, nitride, boride, or combination thereof. Exemplary metallic components include, without limitation, transition metals such as titanium (Ti), vanadium (V), cobalt (Co), nickel (Ni), and transition metal alloys; highly reactive metals such as magnesium (Mg), zirconium (Zr), hafnium (Hf), and aluminum (Al); refractory metals such as tungsten (W), molybdenum (Mo), and tantalum (Ta); metal composites such as aluminum/aluminum oxide and cobalt/tungsten carbide; and metalloids such as silicon (Si). These metallic components typically have a resistivity in the range of $1-100\times10^{-8}$ $\Omega\cdot$m. During the coating process (e.g., thermal spraying), a feedstock (e.g., powder, wire, or solid bar) of the metallic component is melted to produce, e.g., droplets and exposed to a gas containing oxygen, nitrogen, carbon, and/or boron. This exposure allows the molten metallic component to react with the gas to produce an oxide, nitride, carbide, or boride derivative, or combination thereof, on at least a portion of the surface of the droplet.

The nature of the reacted metallic component is dependent on the amount and nature of the gas used in the deposition. For example, use of pure oxygen results in an oxide of the metallic component. In addition, a mixture of oxygen, nitrogen, and carbon dioxide results in a mixture of oxide, nitride, and carbide. The exact proportion of each depends on intrinsic properties of the metallic component and on the proportion of oxygen, nitrogen, and carbon in the gas. The resistivity of the layers produced by the methods herein range from $500$–$50,000 \times 10^{-8}$ $\Omega \cdot m$.

Exemplary species of oxide include $TiO_2$, $TiO$, $ZrO_2$, $V_2O_5$, $V_2O_3$, $V_2O_4$, $CoO$, $Co_2O_3$, $CoO_2$, $Co_3O_4$, $NiO$, $MgO$, $HfO_2$, $Al_2O_3$, $WO_3$, $WO_2$, $Mo_2O_3$, $MoO_2$, $Ta_2O_5$, $TaO_2$, and $SiO_2$. Examples of nitrides include $TiN$, $VN$, $Ni_3N$, $Mg_3N_2$, $ZrN$, $AlN$, and $Si_3N_4$. Desirable carbides include $TiC$, $VC$, $MgC_2$, $Mg_2C_3$, $HfC$, $Al_4C_3$, $WC$, $Mo_2C$, $TaC$, and $SiC$. Exemplary borides include $TiB$, $TiB_2$, $VB_2$, $Ni_2B$, $Ni_3B$, $AlB_2$, $TaB$, $TaB_2$, $SiB$, and $ZrB_2$. Other oxides, nitrides, carbides, and borides are known by those skilled in the art.

Gases

In order to obtain oxides, nitrides, carbides, or borides of a metallic component, the gas that is reacted with the component must contain oxygen, nitrogen, carbon, and/or boron. Exemplary gases include oxygen, nitrogen, carbon dioxide, boron trichloride, ammonia, methane, and diborane. Other gases are known by those skilled in the art.

Thermal Spray

The resistive layers and other layers of a coating of the present invention are desirably deposited using a thermal spray apparatus. Exemplary thermal spray apparatuses include, without limitation, arc plasma, flame spray, Rockide systems, arc wire, and high velocity oxy-fuel (HVOF) systems.

A typical HVOF wire system consists of a gun or spray head where three separate gases come together (see FIG. 1). Propane gas and oxygen are commonly used as fuel gases, and the gas chosen as the reactant gas is used to accelerate the molten droplets and cool the spray nozzle in the gun. Normally, this last function is accomplished through the use of air. The gases are fed to the spray head through flow meters and pressure regulators or through mass flow controllers so that there is a controlled, independent flow for each gas. If it is desired to deliver reduced amounts of reactant gas, it can be mixed with a nonreactant gas, for example, argon, so that the volume and flow are sufficient to operate the gun at appropriate velocities. The mixing may be accomplished by flowmeters and pressure regulators, mass flow controllers, or by the use of pre-mixed cylinders, each of which is generally known to a practitioner skilled in the art. The feedstock, which is wire in this case, is supplied to the gun head by means of a wire feeder that controls the rate at which material is delivered to the gun. The gun itself may be attached to a motion control system such as a linear translator or multiaxis robot.

Figure 2:
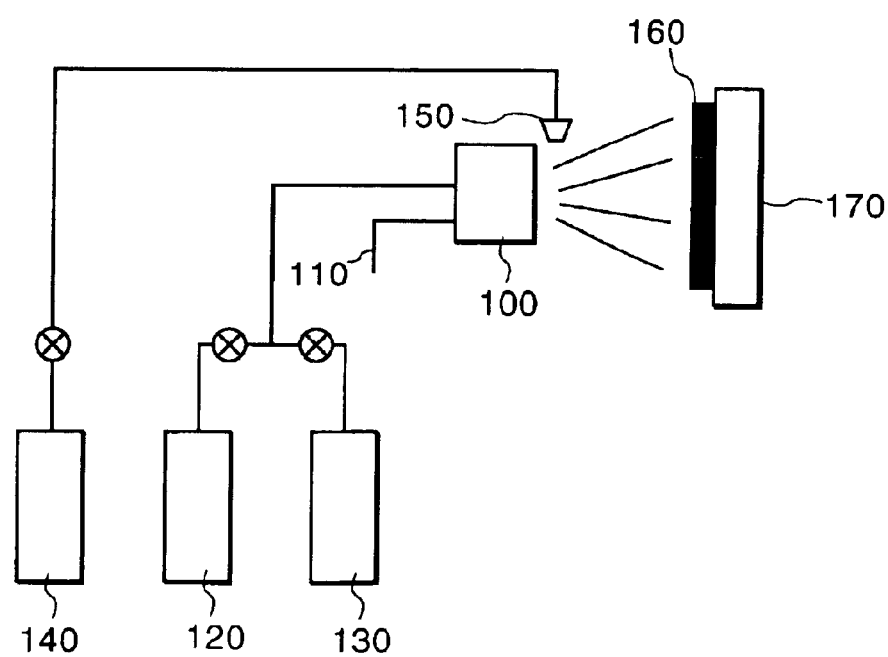
FIG. 2 shows an illustration of a plasma spray system 100 that uses metal powder 110 as feedstock and generates an argon 120/hydrogen 130 plasma to melt the powder. Another reactant gas 140 is supplied to the molten droplets through a nozzle 150. The molten droplets are deposited as a layer 160 on a substrate 170.

The thermal spray apparatus is desirably configured so that a reaction gas may be injected into the molten flux stream of the spray. For combustion systems and arc wire systems, this injection may be accomplished by using the gas as the accelerator, For plasma systems, if the plasma gases do not serve also as the reaction gas, the gas may be injected using an additional nozzle (see FIG. 2). Incorporating additional nozzles for injection of reactant gases is also applicable to other systems.

The composition of the deposited layer may be influenced by the type of thermal spray apparatus used. For example, droplets are emitted very rapidly from an HVOF system in comparison to other techniques, and these droplets are consequently exposed to reactants for a shorter period of time and thus react with the gas to a lesser extent. In addition, layers deposited by HVOF have higher adhesion strength than layers deposited by other systems.

Resistive layers may be deposited in defined patterns on a substrate. The pattern may be defined, for example, by a removable mask. Patterned application allows for the fabrication of more than one spatially separated resistive layer on one or more substrates. Patterned layers also allow controlled heating in localized areas of a substrate.

Microstructure

The characteristic lamellar microstructure of a coating deposited by thermal spray is a direct result of the process. The thermal spray process creates from the feedstock a flux of molten droplets, which are accelerated and directed towards the substrate. The droplets, typically moving at speeds of several hundred meters per second, impact the substrate and very rapidly cool at rates approaching one million degrees per second. This rate of cooling causes very rapid solidification. Nevertheless, during the impact, the droplets deform into platelet-like shapes and stack on top of each other as the spray head is traversed back and forth across the substrate to build up the coating. The microstructure thus assumes a layered configuration, with the flattened particles all aligned parallel to the substrate and perpendicular to the line of deposition.

If the material being deposited undergoes no reactions with the gases present in the flux stream, then the composition of the coating is identical to that of the feedstock. If, however, the molten droplets react with an ambient gas during the deposition process, the composition of the coating differs from that of the feedstock. The droplets may acquire a surface coating of the reaction product, which varies in thickness depending, for example, on the rate of reaction, the temperatures encountered, and the concentration of the gas. In some cases, the droplets react completely; in other cases, the droplets have a large volume fraction of free metal at their centers. The resulting microstructure of the coating is a lamellar structure, one consisting of individual particles of complex composition. The coating has a reduced volume fraction of free metal with the remainder consisting of reaction products distributed in general as material surrounding the free metal contained in each platelet-like particle.

When the gases that are added to the flux stream are chosen to form reaction products, which have a much higher electrical resistivity, then the resultant coating exhibits a bulk resistivity that is higher than the free metallic component. In addition, when the concentration of gas is controlled, thereby controlling the concentration of reaction product, the resistivity of the coating is controlled proportionately. For example, the resistivity of aluminum sprayed in pure oxygen is higher than that sprayed in air because there is a higher concentration of aluminum oxide in the layer and aluminum oxide has a very high resistivity.

Spatially Vvariable Resistivity

The invention also provides methods for producing a coating having a resistivity that is variable, e.g., a continuous gradient or step function, as a function of location on a substrate. For example, the resistivity of the layer may increase or decrease by 50, 100, 200, 500 or 1000% over a distance of 1, 10, or 100 cm. The apparatus used includes a thermal spray gun and a gas source. The gas source includes two or more gases that can be mixed in any arbitrary combination. By controlling the composition of the gas used in the thermal spray gun, the composition, and therefore resistivity, of the coating is controlled. For example, a gradual increase in a reactant in the gas (e.g., oxygen) leads to a gradual increase in the resistivity of the coating. This gradual increase can be used to produce a coating having a gradient of resistivity on a substrate. Similarly, other patterns, e.g., step functions, of resistivity may be formed by appropriate control of the mixture of gases. The mixture of gases may include more than one reactive species (e.g., nitrogen and oxygen) or a reactive and an inert species (e.g., oxygen and argon). A computer may also be used to control the mixing of the gases.

Applications

Coatings. Coatings on substrates can comprise resistive layers of the invention. In addition, other layers may be present in a coating to provide additional properties. Examples of additional coatings include, without limitation, an adhesion layer (e.g., nickel-aluminum alloy), an electrically insulating layer (e.g., aluminum oxide, zirconium oxide, or magnesium oxide), an electrical contact layer (e.g., copper), a thermally insulating layer (e.g., zirconium dioxide), a thermally emissive coating (e.g., chromium oxide), layers for improved thermal matching between layers with different coefficients of thermal expansion (e.g., nickel between aluminum oxide and aluminum), a thermally conductive layer (e.g., molybdenum), and a thermally reflective layer (e.g., tin). These layers may be located between the resistive layer and the substrate (e.g., adhesion layers) or on the side of the resistive layer distal to the substrate. Resistive layers may also be deposited on a nonconducting surface without an electrically insulating layer.

Heaters. A resistive layer is made into a resistive heater by coupling a power supply to the layer. Application of a current through the resistive layer then generates heat resistively. Connections between the power supply and the resistive layer are made, for example, by brazing connectors, soldering wires, or by physical contact using various mechanical connectors. These resistive heaters are advantageous in applications where localized heating is desired.

A. Injection mold. One application of a resistive heater of the invention is in injection molding. An injection mold has a cavity into which a melt of a thermoplastic material is forced. Once the material cools and hardens, it can be removed from the mold, and the process can be repeated. An injection mold of the invention has a coating containing a resistive heating layer on at least a portion of the surface of the cavity. The resistive heating layer may be covered with a metal layer (e.g., molybdenum or tungsten). The purpose of placing a heater layer in the cavity of a mold and in the conduits to that cavity is to better control the solidification process and reduce cycle times. Heaters in close proximity to the melt can be used to keep the melt hot so that it flows better with less pressure, and to cool the melt during the solidification phase in a controlled way.

Figure 3:
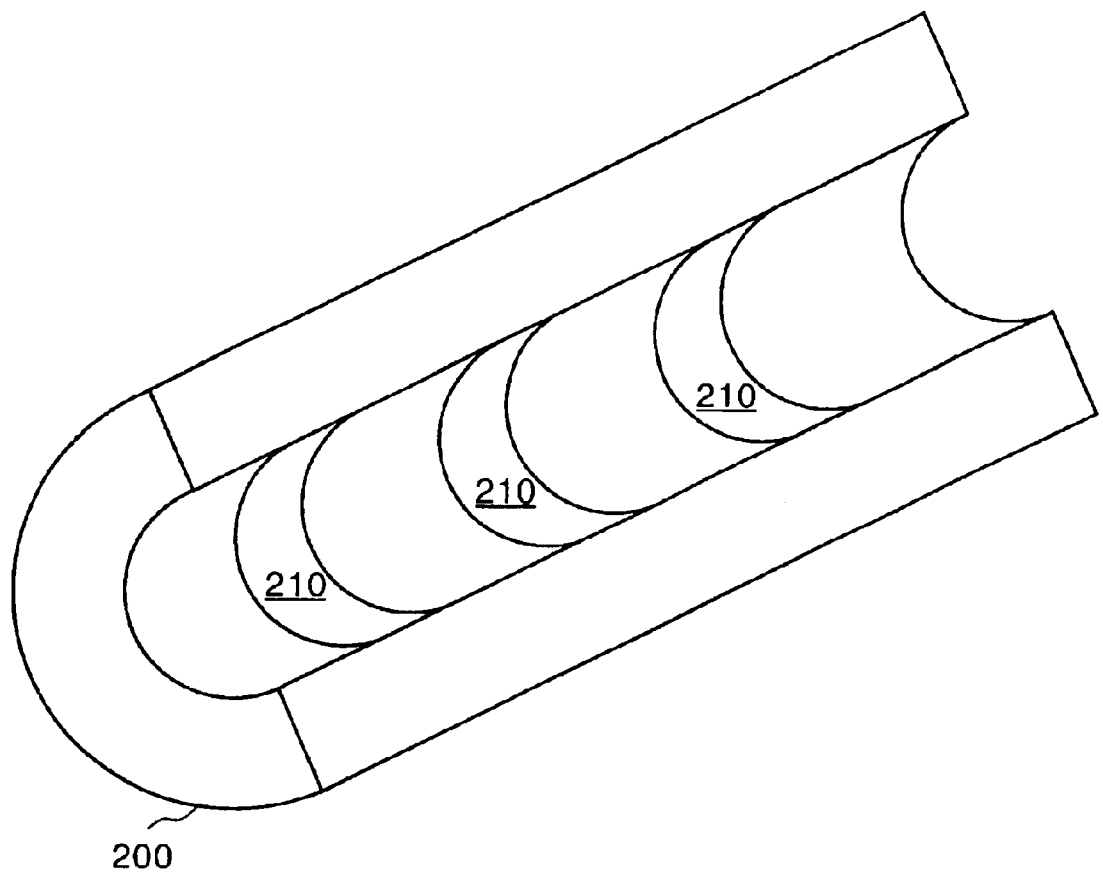
FIG. 3 shows an illustration of a spray deposited resistive heater designed for the inside surface of a roller 200. A resistive layer 210 is deposited in a pattern of rings for the production of resistive heaters that heat in parallel.

B. Heated rollers. Heated rollers are used in many industries include papermaking, printing, laminating, and paper, film, and foil converting industries. One application of a resistive heater of the invention is in dryers in paper manufacturing (see FIG. 3). Paper is manufactured in several stages, including forming, pressing, and drying. The drying stage typically removes water remaining from the pressing stage (typically about 30%) and reduces the water content typically to about 5%. The drying process typically involves contacting both sides of the paper with heated cylindrical rollers. Accordingly, a roller for a paper dryer having a resistive heater layer may be produced by methods of the invention. A coating containing a resistive heater layer is deposited on the interior or exterior of such a roller. Other coatings such as anticorrosive coatings may also be applied. The heater may be applied in a defined pattern through masks in the deposition step. For instance, a pattern of zones that concentrates heat at the ends of the roller provides a more uniform heat to the paper since the ends cool more quickly than the center of the roller. Examples of rollers that contain heating zones are given in U.S. Pat. No. 5,420,395, hereby incorporated by reference.

The deposited resistive heaters may be applied to a dryer can (or roller) used in the paper making process to remove water from pulp. In one example, the heaters are applied to the inside surface of a steel roller or can. First, an insulator layer of aluminum oxide is applied by thermal spray and sealed with nanophase aluminum oxide or some other suitable high temperature dielectric sealant. Then, the resistive heater layer is deposited using a high velocity oxy-fuel wire spray system, titanium wire, and nitrogen gas. The terminals are secured to the inside of the can by welding or threaded studs and are insulated such that electrical power may be applied to the deposited resistive layer. Finally, the entire heater layer is coated with high temperature silicone or another layer of thermally sprayed aluminum oxide, which is sealed as before.

Alternatively, the heater layer and insulator layers may be applied to the outside surface of the dryer can and coated with a thermally sprayed metallic layer, such as nickel. The nickel is then ground back to the desired dimension. For smaller heated roller applications, a metal casing may be affixed or shrunk onto the roller with its heaters applied.

C. Semiconductor wafer processing system. Heaters are also used in semiconductor wafer processing (see WO 98/51127, hereby incorporated by reference). A semiconductor wafer processing system of the invention includes a chamber, one or more resistive heaters, and means for mounting and manipulating a semiconductor wafer. The system may be used in wafer processing applications such as annealing, sintering, silicidation, and glass reflow. A system including such a heater is also useful for promoting reactions between wafers and reactive gases, for example, oxidation and nitridation. In addition, the system may be used for epitaxial reactions, wherein a material such as silicon is deposited on a heated surface in monocrystalline form. Finally, such a system allows chemical vapor deposition of the product of a gas phase reaction in noncrystalline form on a heated substrate.

Additional applications of the heaters of the invention are as follows:

1. blanket heater on pipe with metal contact layer on top and aluminum oxide insulator on the contact.

2. heater tip for natural gas ignitor on kitchen stove, oven, water heater or heating system.

3. free standing muffle tube fabricated by sprayforming on a removable mandrel.

4. low voltage heater coating for bathroom deodorizer.

5. Laboratory Applications: Resistively heated coated glass and plastic lab vessels; work trays; dissection trays; cell culture ware; tubing; piping; heat exchangers; manifolds; surface sterilizing laboratory hoods; self-sterilizing work surfaces; sterilizing containers; heatable filters; frits; packed beds; autoclaves; self-sterilizing medical bacterial and tissue culture tools (e.g., loops and spreaders); incubators; benchtop heaters; flameless torches; lab ovens; incinerators; vacuum ovens; waterbaths; drybaths; heat platens; radiography pens; reaction vessels; reaction chambers; combustion chambers; heatable mixers and impellors; electrophoresis equipment; anode and cathode electrodes; heating electrodes; electrolysis and gas generation systems; desalinization systems; deionizing systems; spectroscopy and mass spectroscopy equipment; chromatography equipment; HPLC; IR sensors; high temperature probes; thermoplastic bags; cap and tube sealers; thermal cyclers; water heaters; steam generation systems; heated nozzles; heat activated in-line valves; shape-memory alloy/conductive ceramic systems; lyophilizers; thermal ink pens and printing systems;

6. Medical and Dental Applications: Self-sterilizing and self-cauterizing surgical tools (e.g., scalpel blades, forceps);

incubators; warming beds; warming trays; blood warming systems; thermally controlled fluid systems; amalgam heaters; dialysis systems; phoresis systems; steamer mops; ultra high temperature incineration systems; self sterilizing tables and surfaces; drug delivery systems (e.g., medicated steam inhaler; thermal activated transcutaneal patches); dermatological tools; heatable tiles; wash basins; shower floors; towel racks; mini-autoclaves; field heater cots; body warming systems;

7. Industrial applications: Sparkless ignition systems; sparkless combustion engines; bar heaters; strip heaters; combustion chambers; reaction chambers; chemical processing lines; nozzles and pipes; static and active mixers; catalytic heating platforms (e.g., scrubbers); chemical processing equipment and machines; environmental remediaton systems; paper pulp processing and manufacturing systems; glass and ceramic processing systems; hot air/air knife applications; room heaters; sparkless welding equipment; inert gas welding equipment; conductive abrasives; heater water-jet or liquid-jet cutting systems; heated impellers and mixing tanks; fusion and resistance locks; super heated fluorescent bulbs that use new inert gases; heatable valves; heatable interconnects and interfaces of all types; heatable ceramics tiles; self heating circuit boards (e.g., self-soldering boards; self-laminating boards); fire hydrant heaters; food processing equipment (e.g., ovens, vats, steaming systems, searing systems, shrink wrapping systems, pressure cookers, boilers, fryers, heat sealing systems); in-line food processing equipment; programmable temperature grids and platens to selectively apply heat to 2-D or 3-D structures (e.g., thermoplastic welding and sealing systems); point pulsing heaters; battery operated heaters; inscribers and marking systems; static mixers; steam cleaners; IC chip heaters; LCD panel heaters; condensers; heated aircraft parts (e.g., wings, propellers, flaps, ailerons, vertical tail, rotors); conductive ceramic pens and probes; self-curing glazes; self-baking pottery; walk-in-ovens; self-welding gaskets; heat pumps;

8. Home and office applications: Heatable appliances of all types; self cleaning ovens; igniters; grills; griddles; susceptor-based heatable ceramic searing systems for microwaves ovens; heated mixers; impellers; stirrers; steamers; crock pots; pressure cookers; electric range tops; refrigerator defrost mechanisms; heated ice cream scoops and serving ladles; operated hand held heaters and warmers; water heaters and switches; coffee heater systems; heatable food processors; warmable toilet seats; towel racks; clothes warmers; bodywarmers; cat beds; instantly heated irons; water bed heaters; washers; driers; faucets; heated bathtubs and wash basins; dehumidifiers; hose nozzles for heated washing or steam cleaning; platens to heat moisturized wipes; bathroom tissue heaters; towel heaters; heated soap dispensers; heated head razors; evaporative chilling systems; self-heating keys; outdoor $CO_2$ and heat generating systems for bug attraction and killing systems; aquarium heaters; bathroom mirrors; chair warmers; heatable blade ceiling fans; floor heaters;

9. Whole surface geometric heaters; direct contact heaters; pure ceramic heating systems; coated metal heating systems; self-detecting fault systems; plasma sprayed thermocouples and sensors; plasma spheredized bed reaction systems (e.g., boron gas generation system for the semiconductor industry; heatable conductive chromatographic beds and beads systems); pre-heaters to warm surfaces prior to less costly or more efficient heating methods; sensors (e.g., heater as part of integrated circuit chip package);

10. Microwave and electromagnetic applications: Magnetic susceptor coatings; coated cooking wear; magnetic induction ovens and range tops;

11. Thermoplastic manufacturing applications: resistively heated large work surfaces and large heaters; heated injection molds; tools; molds; gates; nozzles; runners; feed lines; vats; chemical reaction molds; screws; drives; compression systems; extrusion dies; thermoforming equipment; ovens; annealing equipment; welding equipment; heat bonding equipment; moisture cure ovens; vacuum and pressure forming systems; heat sealing equipment; films; laminates; lids; hot stamping equipment; shrink wrapping equipment;

12. Automotive applications: Washer fluid heaters; in-line heaters and nozzle heaters; windshield wiper heaters; engine block heaters; oil pan heaters; steering wheel heaters; resistance-based locking systems; micro-catalytic converters; exhaust scrubbers; seat heaters; air heaters; heated mirrors; heated key locks; heated external lights; integral heater under paint or in place of paint; entry and exit port edges; sparkless "sparkplugs"; engine valves, pistons, and bearings; mini-exhaust catalytic pipes;

13. Marine applications: antifouling coatings; de-iceable coatings (e.g., railings, walkways); electrolysis systems; desalinization systems; on-board seafood processing systems; canning equipment; drying equipment; ice drills and corers; survival suits; diving suit heaters; desiccation and dehumidifying systems;

14. Defense applications: High temperature thermal targets and decoys; remora heaters; MRE heating systems; weapons preheaters; portable heaters; cooking devices; battery powered heatable knife; noncombustion based gas expansion guns; jet de-icing coating on wings etc; thermal fusion self destruction systems; incinerators; flash heating systems; emergency heating systems; emergency stills; desalinization and sterilization systems;

15. Signage applications: heated road signs, thermoresponsive color changing signs; inert gas (e.g., neon) impregnated microballoons that fluoresce in magnetic fields;

16. Printing and photographic applications: copiers; printers; printer heaters; wax heaters; thermal cure ink systems; thermal transfer systems; xerographic and printing heaters; radiographic and photographic film process heaters; ceramic printers;

17. Architectural applications: heated walkway mats, grates, drains, gutters, downspouts, and roof edges;

18. Sporting applications: heated golf club heads; bats; sticks; handgrips; heated ice skate edges; ski and snowboard edges; systems for de-icing and re-icing rinks; heated goggles; heated glasses; heated spectator seats; camping stoves; electric grills; heatable food storage containers;

In one embodiment, the heater of the present invention may be used in an injection molding system to manage and control the flow of the molten material throughout the mold cavity space. The heater may be deposited as part of a coating directly on the surface of the mold cavity area to precisely manage the temperature profile in the moving, molten material. For some applications, the heater may have variable resistivity across the surface of the mold cavity area to allow for fine adjustments to the molten material temperature gradient, thus providing precise heat flow control and constant (or precisely-managed) viscosity and velocity of the melt flow. Mold heat management and flow control depend on the specific application and the type of material used.

Desirably, the heater is used in conjunction with a thermal sensor (e.g., a thermistor or thermocouple) and/or a pressure sensor. Direct deposit of the coating containing the heater onto the mold cavity area can reduce or eliminate air gaps between the heater and the heated surface, providing intimate and direct contact for improved temperature transfer between the heater and the heated surface.

Figure 4:
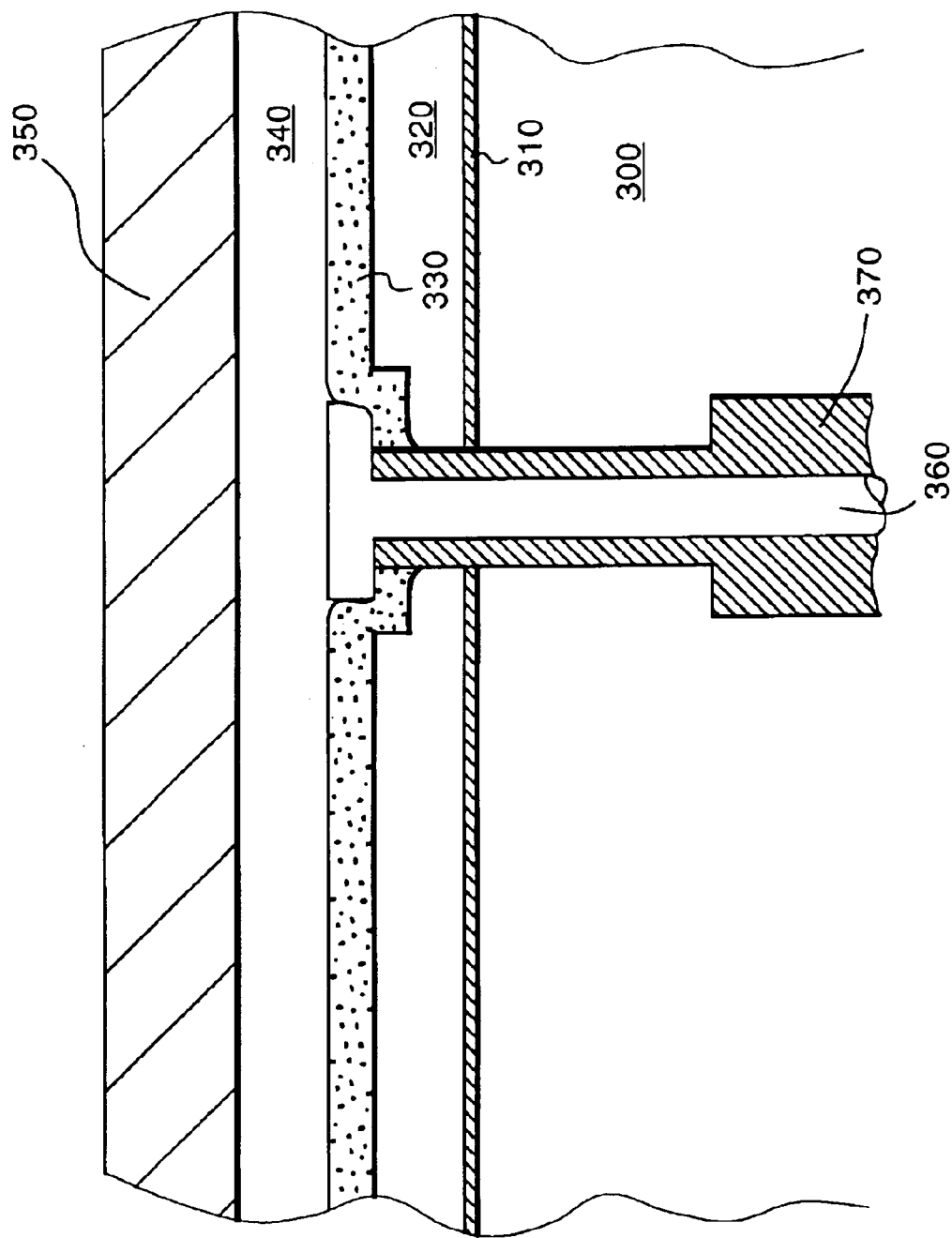
FIG. 4 shows an illustration of a cross section of an injection mold including a resistive heater. The surface of a metal mold 300 includes several layers: an adhesion layer 310, an electrically and thermally insulating layer 320, a metallic resistive layer 330, an electrically insulating and thermally conducting layer 340, and a metal layer 350. A terminal 360, insulated from the mold by a terminal insulator 370, connects the resistive layer to a power supply.

In one example, the heater is applied to the mold cavity of a plastics mold (see FIG. 4). First, a NiCrAlY alloy adhesion (or bond) coat is applied to the cavity to a thickness of about 0.002" using a High Velocity Oxy-Fuel Wire (HVOF) thermal spray system. Next a zirconium oxide layer measuring 0.012" is applied with an arc plasma spray system. The zirconium oxide electrically and thermally insulates the heater from the steel mold, which is water cooled. A resistive heater layer is applied next as a sheet or coating of material 0.008" thick on top of the zirconium oxide. The zirconium is deposited using a HVOF thermal spray system using propane and oxygen for the fuel gases to melt the metal wire and pure nitrogen as an accelerator. The nitrogen promotes formation of zirconium nitride in the molten flux and boosts the resistivity of the coating from 0.00007 $\Omega$·cm for pure zirconium to 0.003 $\Omega$·cm for the deposited coating. Next, a micro-abrasive blaster using aluminum oxide media and attached to a multiaxis machining center is used to delineate the desired heater element pattern on the mold. Zirconium terminals are inserted at this stage through holes machined in the mold. They are inserted to make electrical contact with the heater layer. A second 0.015"-thick layer of ceramic electrical insulator is then applied to the top of the heater. Aluminum oxide is chosen for this layer because it has higher thermal conductivity than the zirconium oxide. The aluminum oxide is applied using an arc plasma system and is then sealed with nanophase aluminum oxide. Finally, a metal layer of tungsten is applied to a thickness of 0.040" by arc plasma spray and machined back to the desired dimension. The mold cavity is completed by electroplating a layer of nickel on top of the tungsten.

OTHER EMBODIMENTS

All publications and patents mentioned in the above specification are herein incorporated by reference. Various modifications and variations of the described method and system of the invention will be apparent to those skilled in the art without departing from the scope and spirit of the invention. Although the invention has been described in connection with specific preferred embodiments, it should be understood that the invention as claimed should not be unduly limited to such specific embodiments. Indeed, various modifications of the described modes for carrying out the invention that are obvious to those skilled in thermal spraying, coatings, thermoplastics, or related fields are intended to be within the scope of the invention.

Other embodiments are in the claims.

What is claimed is:

1. A method of making a resistive heater having a controlled resistivity, having a substrate, a resistive heating layer, and a power source, comprising the steps of:

determining a desired resistivity of said resistive heater layer;

selecting a solid metallic component and at least one reactant gas;

selecting a proportion of said solid metallic component and said at least one reactant gas, so that when combined said desired resistivity of said resistive heater layer results;

promoting reaction of at least a portion of said solid metallic component and said reactant gas by melting said at least a portion of said solid metallic component resulting in a stream of molten droplets, and providing controlled introduction of said reactant as to said molten droplets, thereby combining said molten droplets and said reactant gas, resulting in a free metal and reaction product;

depositing said combined free metal and reaction product on said substrate to form said resistive heater layer having said desired resistivity; and providing power to said resistive heater layer.

2. The method of claim 1, wherein said reaction product is one or more oxide, nitride, carbide, and/or boride derivatives of said metallic component.

3. The method of claim 1, wherein said reactant gas that is controlled in introduction to said molten droplets during said step of promoting reaction of at least a portion of said solid metallic component, comprises one or more of oxygen, nitrogen, carbon, and boron.

4. The method of claim 1, further comprising the step of providing an electrically insulating layer between said substrate and said resistive layer.

5. The method of claim 4, further comprising the step of providing an adhesion layer between said insulating layer and said substrate.

6. The method of claim 5, wherein said adhesion layer comprises nickel-chrome alloy or nickel-chrome-aluminum-yttrium alloy.

7. The method of claim 1, further comprising the step of providing a heat reflective layer between said resistive heater layer and said substrate.

8. The method of claim 7, wherein said heat reflective layer comprises zirconium oxide.

9. The method of claim 1, further comprising the step of providing a ceramic layer superficial to said resistive heater layer.

10. The method of claim 9, wherein said ceramic layer comprises aluminum oxide.

11. The method of claim 1, further comprising the step of providing a metallic layer superficial to said resistive heating layer.

12. The method of claim 11, wherein said metallic layer comprises molybdenum or tungsten.

13. The method of claim 1, wherein said metallic component is titanium (Ti), silicon (Si), aluminum (Al), zirconium (Zr), cobalt (Co), nickel (Ni), iron (Fe), or alloys thereof.

14. The method of claim 1, wherein said reaction product is one or more nitride, carbide, and/or boride derivatives of said metallic component.

15. The method of claim 1, wherein said reaction product is two or more oxide, nitride, carbide, and/or boride derivatives of said metallic component.

16. The method of claim 1, wherein said solid metallic component is not oxidized prior to said step of promoting reaction.

17. The method of claim 1, wherein said solid metallic component is a solid metallic wire.

18. The method of claim 1, wherein there is no reaction of said solid metallic component with said reactant gas prior to said step of promoting reaction.

* * * * *